United States Patent [19]

Huard

[11] Patent Number: 4,875,130
[45] Date of Patent: Oct. 17, 1989

[54] ESD LOW RESISTANCE INPUT STRUCTURE

[75] Inventor: Jeff Huard, Puyallup, Wash.

[73] Assignee: National Semiconductor Corporation, Santa Clara, Calif.

[21] Appl. No.: 215,865

[22] Filed: Jul. 6, 1988

[51] Int. Cl.[4] .............................................. H02H 9/04
[52] U.S. Cl. ....................................... 361/56; 361/91; 361/92; 361/111; 357/23.13; 307/544; 307/557
[58] Field of Search ....................... 361/56, 90, 91, 92, 361/111; 357/23.13; 307/540, 542, 544, 545, 551, 557, 559, 560, 561, 564, 565, 566

[56] References Cited

U.S. PATENT DOCUMENTS

| | | | |
|---|---|---|---|
| 3,787,717 | 1/1974 | Fischer et al. | 361/56 |
| 4,366,522 | 12/1982 | Baker | 361/91 |
| 4,400,711 | 8/1983 | Avery | 361/56 X |
| 4,712,152 | 12/1987 | Iio | 361/56 |
| 4,763,184 | 8/1988 | Krieger et al. | 361/56 X |

FOREIGN PATENT DOCUMENTS

| | | | |
|---|---|---|---|
| 0042581 | 12/1981 | European Pat. Off. | 357/23.13 |
| 2090701 | 7/1982 | United Kingdom | 357/23.13 |

Primary Examiner—A. D. Pellinen
Assistant Examiner—H. L. Williams
Attorney, Agent, or Firm—Steve Caserza; Lee Patch

[57] ABSTRACT

An input protection structure effectively protects input circuitry from positive-going ESD pulses. The input protection structure includes a transistor having a reduced beta, connected in series with one or more diodes between the input pin and VCC. In one embodiment, the transistor having reduced beta is constructed in the same manner as a fuse device. The structure is formed in an integrated fashion, without the need for metallic interconnections within the structure itself, thereby decreasing impedance while minimizing surface area in the integrated surface.

23 Claims, 5 Drawing Sheets

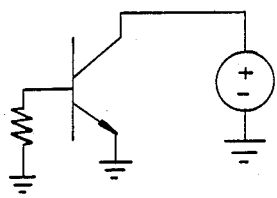
FIG.3a
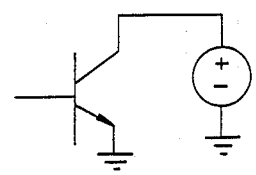
FIG.3b
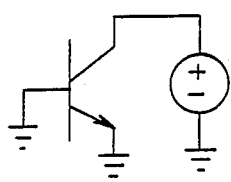
FIG.3c
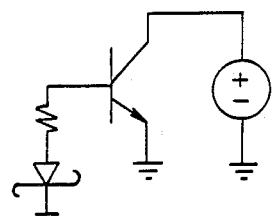
FIG.3d
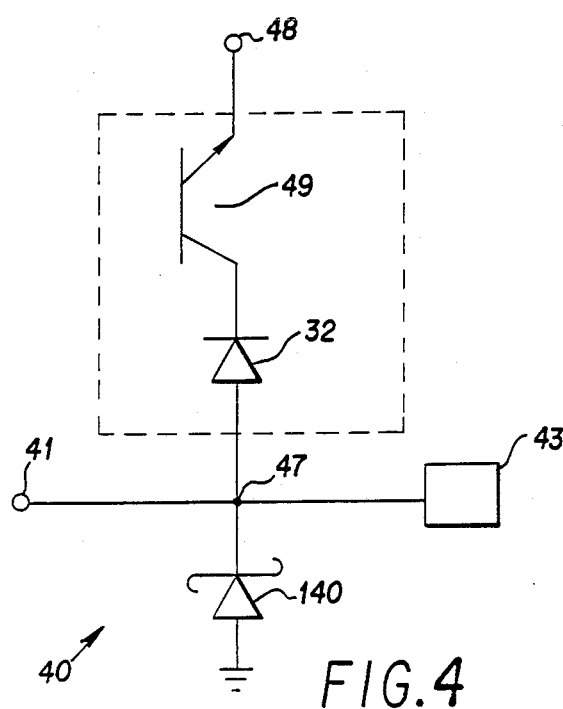
FIG.5
FIG.4

UNINTEGRATED                    INTEGRATED

ESD LOW RESISTANCE INPUT STRUCTURE

BACKGROUND OF THE INVENTION

This invention relates to integrated circuits, and more particularly to an input structure which is highly impervious to damage caused by electrostatic discharge (ESD).

Semiconductor devices and integrated circuits in particular are highly susceptible to damage from electrostatic discharge. ESD can occur from a number of sources, but a major source is static electricity generated by persons handling the integrated circuits. It is not uncommon for a person to be charged with static electricity to a potential of hundreds or even thousands of volts. When a person charged to such a potential touches an integrated circuit, the integrated circuit is often damaged. This causes serious problems in manufacturing and distribution systems, where yield is decreased. Perhaps a more serious problem is that some parts are destroyed after testing, thereby allowing faulty devices to find their way to end users.

FIG. 1 shows a typical prior art input protection device used in integrated circuits. As shown in FIG. 1, an integrated circuit includes input pin 21 and input buffer circuitry 23. Regardless of the type of input buffer 23 used, the semiconductor device will fail if input buffer 23 is damaged, such as from the application of an ESD pulse. The current transferred during the application of an ESD pulse to input pin 21 is typically on the order of milliamperes, sufficient current to destroy typical prior art input buffers.

In an attempt to reduce the damage caused by ESD, the prior art circuit of FIG. 1 includes Schottky diode 22 having its cathode connected to input pin 21 via node 27, and its anode connected to ground. In this manner, when a negative-going ESD pulse is applied to input pin 21, Schottky diode 22 turns on, conducting current from ground to input pin 21. This clamps the input voltage to a predetermined negative voltage (typically −0.6 volts), thereby discharging the ESD pulse without allowing the voltage on node 27 to rise to a damaging level. However, while Schottky diode 22 is quite effective in discharging negative ESD pulses of great magnitude (often as high as about 6000 volts), it is less effective in protecting input buffer 23 from damage due to positive ESD pulses.

When a positive ESD pulse applied to input pin 21 exceeds the breakdown voltage of Schottky diode 22 (typically 20 volts), reverse breakdown occurs, and the ESD pulse is discharged from input pin 21 to ground. With a positive ESD pulse having a magnitude greater than about 200 volts, a relatively large amount of power is dissipated by Schottky diode 22, thereby destroying Schottky diode 22 by shorting its cathode to ground. When this happens, the integrated circuit is destroyed because input pin 21 is now effectively connected to ground. Thus, while Schottky diode 22 serves to prevent damage to input buffer 23 due to negative ESD pulses, it is itself damaged by certain positive ESD pulses.

It is therefore desirable to shunt positive-going ESD pulses to VCC. However, it is desirable not to shunt positive ESD pulses to VCC by clamping input terminal 21 by using a diode having its anode connected to input terminal 21 and its cathode connected to VCC. Such a clamping technique prevents the use of input voltages much greater than VCC, and it is oftentimes desirable to construct an input circuit 23 which is responsive to such high voltages in order to enter a test mode. In other words, many integrated circuit devices, unbeknownst to the end user, are constructed in such a manner as to allow the manufacturer to perform specific tests by placing input voltages greater than VCC on selected input pins. These voltages range from approximately 11 to 14 volts over the complete military range of temperature and voltage levels for VCC, and allow the manufacturer to perform additional tests on the device without requiring additional input pins for this purpose. Yet another reason why input pins 21 cannot simply be shunted to VCC by a Schottky diode is that oftentimes, in a large system, certian parts will be powered down when not in use by lowering their power supply voltage VCC to ground. In this event, signals appearing on a bus which is connected to an input pin of a powered-down device would be shunted to the powered-down device VCC, namely 0 volts. Thus, a powered-down device would drag down the entire bus to which its input pins are connected, clearly an unattractive limitation.

Another prior art technique for preventing ESD damage to an input buffer is shown in the schematic diagram of FIG. 2a. Input protection circuit 30 is connected to input pin 31 and serves to discharge ESD pulses applied to input pin 31, thereby preventing ESD damage to input buffer 33. Schottky diode 22 provides protection against negative going ESD pulses, as previously described with regard to FIG. 1. As shown in FIG. 2a, input pin 31 is connected via node 37 to VCC terminal 38. NPN transistor 34 is connected in series with diodes 35 and 36 between VCC terminal 38 and node 37. The collector and base of NPN transistor 34 are connected together in order to cause NPN transistor 34 to form a zener diode having a breakdown voltage of approximately 6 volts. When a positive ESD pulse is applied to input pin 31, diodes 35 and 36 become forward biased, and the emitter-base junction of transistor 34 experiences zener breakdown at a zener voltage of about 6 volts. In this event, current flows from input pin 31 to VCC terminal 38, thereby discharging the ESD pulse and limiting the voltage applied to input buffer 33 to a voltage equal to VCC (typically 14 volts) plus the forward bias voltage drops of diodes 35 and 36 (typically about 0.85 volts each) plus the emitter-base breakdown voltage (zener voltage) of transistor 34 (typically 6 volts), for a total of about 21.7 volts. Once emitter-base breakdown occurs, diodes 35 and 36 and transistor 34 provide a resistive path between input pin 31 and VCC terminal 38, thereby providing a discharge path for the ESD pulse. The relationship between the voltage on input pin 31 and the current through the path formed by diodes 35 and 36 and transistor 34 is shown in FIG. 6 as line 6a. Of importance, the resistance provided by this path is relatively large, and thus causes an attendant increase in the voltage received by input buffer 33 for large ESD pulses. Such prior art circuits have proven to be useful in preventing damage to Schottky diode 22 for ESD pulses as high as about 1,000 volts. However, above this level of ESD pulses, the relatively high resistance of the circuit of FIG. 2a still allows excessive voltage to be placed on node 37, allowing Schottky diode 22 to be damaged.

FIG. 2b shows a typical layout for the prior art circuit of FIG. 2a. Metal interconnect 38 serves as VCC terminal 38 of FIG. 2a, having contact 34c to the collector-base region 34a of transistor 34. Metal interconnect 40 connects emitter 34b of transistor 34 via emitter contact 34d to cathode 35a of diode 35. Another metalization interconnect 41 connects anode 35b of diode 35 to cathode 36a of diode 36. Yet another metal interconnect 37 connects anode 36b of diode 36 to input pin 31 and input buffer 33. Unfortunately, this prior art layout provides a significant amount of device and contact resistance.

Heretofore, we have been discussing the requirements for protecting input circuits of an integrated circuit from damage caused by ESD. It is widely recognized that input structures are far more susceptible to damage caused by ESD than are integrated circuit output structures. FIG. 3 is a schematic diagram of a typical TTL output buffer which receives a digital signal on input terminal 11 and provides a TTL level output signal on output terminal 19. Schottky diode 21 helps clamp negative-going ESD pulses appearing on output terminal 19. Such output structures can also withstand very high positive ESD voltages, oftentimes in excess of 4,000 volts. The reason for this is that, for a positive ESD pulse applied to output terminal 19, pulldown transistor 16 breaks down in a BVCEX mode.

As is well known, the collector-emitter junction of a bipolar transistor will "break down" when the transistor turns on in response to leakage current flowing across the reverse biased collector-base junction, when that leakage current is sufficient to cause the transistor to turn on. Naturally, the higher the collector voltage with respect to the base, the greater this leakage current, and the more likely the collector-emitter "breakdown". The type of termination placed on the base is very important in determining the voltage which can be applied to the collector without causing collector-emitter "breakdown". Various terminations are shown in FIGS. 3a through 3d. Naturally, the highest collector-emitter breakdown voltage achieved when the base of the transistor is shorted to ground (BVCES), since collector-base leakage current is shunted to ground. The lowest collector-emitter breakdown voltage occurs when the base is left floating or "open" (BVCEO), since all of the collector-base leakage current is available to form base-emitter current which tends to turn on the transistor. Somewhere between these two extremes lies the case when the transistor base is terminated in a resistor to ground (BVCER), or when the base is terminated through another mechanism (BVCEX), as is shown in FIG. 3d in which the base is terminated through a resistor connected in a series with a Schottky diode.

However, prior to this invention input structures exhibiting a BVCEX break down were unknown as were the advantages of utilizing BVCEX breakdown in an input stage.

SUMMARY

In accordance with the teachings of this invention, a novel input protection structure is provided which effectively protects input circuitry from positive-going ESD pulses. The input protection structure includes a transistor having a reduced beta, connected in series with one or more diodes between the input pin and VCC. In one embodiment, the transistor having reduced beta is constructed in the same manner as a fuse device. The structure is formed in an integrated fashion, without the need for metallic interconnections within the structure itself, thereby decreasing impedance in order to more effectively discharge ESD pulses, while minimizing surface area in the integrated circuit, thereby being fabricated at minimum cost.

One embodiment of a circuit constructed in accordance with the teachings of this invention includes an input terminal for receiving an input signal, a first supply terminal for receiving a first supply voltage, and a first clamp circuit for clamping the voltage level on said input terminal, thereby preventing said voltage level from exceeding a predefined magnitude in a first polarity, said first clamp circuit being connected between said input terminal and said first supply terminal, said first clamp circuit comprising a reduced beta bipolar transistor having a first current handling terminal connected to said first supply terminal and a second current handling terminal connected to said input terminal.

BRIEF DESCRIPTION OF THE DRAWINGS

FIG. 2b is a plan view of the layout of the circuit of FIG. 2a;

FIGS. 3a through 3d are schematic diagrams representing various ways of terminating the base of a bipolar transistor;

FIG. 4 s a schematic diagram of one embodiment of an input protection circuit constructed in accordance with the teachings of this invention;

FIG. 5 is a schematic diagram of an alternative component for use in the circuit of FIG. 4;

FIG. 8b is a plan view of the metallic interconnects used in the embodiment of this invention shown in FIG. 8a.

DETAILED DESCRIPTION

Figure 1:
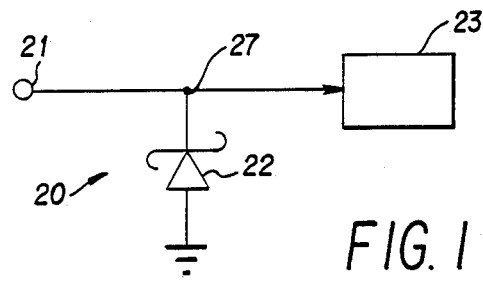
FIG. 1 is a schematic diagram of a prior art technique for providing input circuit protection for negative-going ESD pulses.
Figure 2A:
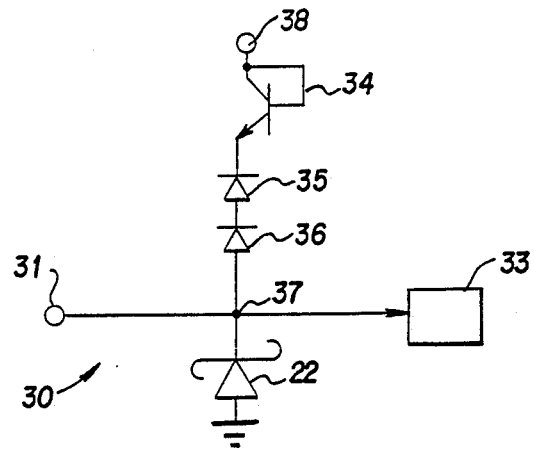
FIG. 2a is a schematic diagram of a prior art circuit which provides protection against both positive and negative ESD pulses.
Figure 2B:
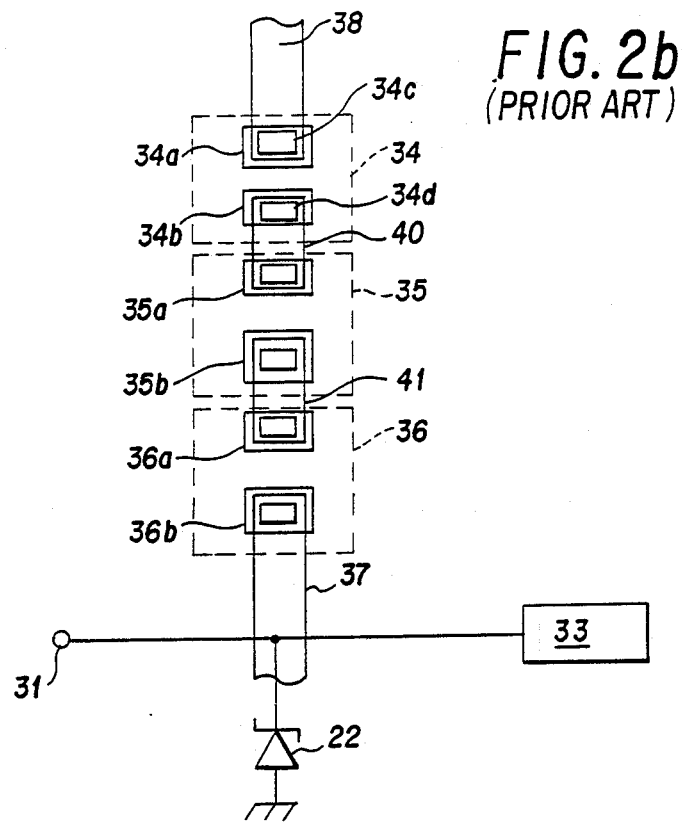
Figure 3:
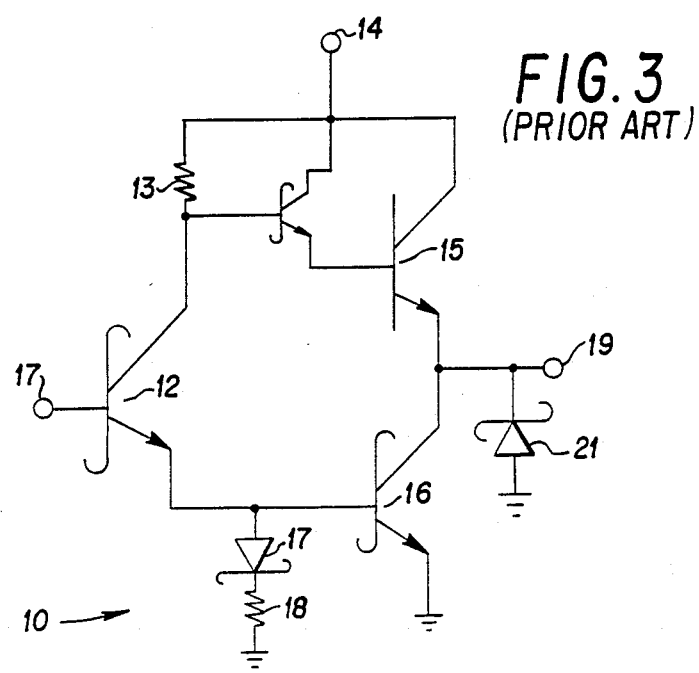
FIG. 3 is a schematic diagram of a typical prior art TTL output buffer.

FIG. 4 is a schematic diagram of one embodiment of an input protection circuit constructed in accordance with the teachings of this invention. If desired, Schottky diode 140 is used to provide protection against negative ESD pulses, as previously described with regard to the circuit of FIG. 1. However, in order to provide protection against damage due to positive ESD pulses, fuse device 49, together with diode 32, are connected between input pin 41 and VCC terminal 48. Unlike the prior art, in accordance with the teachings of this invention, fuse device 49 is used which has a breakdown voltage of about 8 volts. It is desired to provide an input breakdown voltage as low as possible, but slightly greater than the maximum voltage input signed which will be applied to input terminal 41, such that $$V_{CL} = V_{32} + V_{49} + V_{cc};$$

where $V_{CL}$ = the input clamp voltage;
$V_{32}$ = the forward bias voltage drop across diode 32 (approximately 0.8 volts);
$V_{49}$ = the voltage drop across device 49; and
$V_{cc}$ = the supply voltage applied to terminal 48, typically 4.5 V minimum.

Thus, $$V_{49} = V_{CL} - 0.8\ V - 4.5\ V;$$

for a maximum desired input signal voltage of 12 volts,
$V_{CL}$ is set to about 13 volts, and
$V_{49}$ is approximately 7.7 volts.

By clamping input pin 41 to a voltage of about 13 volts protection against positive ESD pulses is provided while allowing input pin 41 to receive voltages above VCC (in this example up to approximately 12 volts) for the purpose of entering certain manufacturers' test modes. Also, VCC terminal 48 can be powered down to 0 volts without causing a TTL level appearing on input pin 41 to be clamped to 0 volts.

When this embodiment is used in circuits which include other fuse devices, such as in programmable logic devices, or programmable memories, fuse 49 can be fabricated in the same manner as the programmable fuse devices. However, in a preferred embodiment, fuse 49 is constructed larger than programmable fuse devices in order to provide a lower impedance to ESD pulses being discharged to VCC terminal 48, and for mainimizing the potential for damage to fuse 49 during the discharge of ESD pulses. For example, in one embodiment, the programmable fuses used elsewhere in the device require approximately 50 mA in order to be shorted during the programming mode, while fuse device 49 is constructed to require from 150 to 200 mA in order to be shorted. This provides fuse device 49 with a lower impedance and makes fuse device 49 less prone to damage during discharge of ESD pulses.

If desired, a device other than fuse 49 can be used in its place, so long as it has a breakdown voltage of 8 volts or higher, for the example stated above. For example, FIG. 5 shows replacement circuit 49 which can be used in place of fuse device 49 of FIG. 4. Referring to FIG. 5, replacement circuit 49 includes NPN transistor 49a having its base connected to its emitter via termination resistor 49b. By connecting the base and emitter of transistor 49a in this manner, the beta of transistor 49a is effectively reduced, as is well known in the art. It is important to provide a transistor having reduced beta in order to achieve the desired breakdown voltage.

In one embodiment of this invention, the impedance is only one third that of prior art clamping devices. Furthermore, referring to FIG. 4, by integrating fuse device 49 (or its replacement device such as the one shown in FIG. 5) with diode 32 to form a two-terminal device, the overall impedance from input pin 41 to VCC terminal 48 is reduced by approximately 50% as compared with a structure where devices 49 and 32 are constructed separately, and interconnected via metallic interconnections and contacts. In a structure such as this which is intended to discharge ESD pulses, having a low impedance is of utmost importance in order to provide rapid discharge of the ESD pulse and thus preventing the ESD voltage from remaining at a high potential. Furthermore, as a side benefit to reducing impedance, integrating components 32 and 49 provides savings in integrated surface area about 75% for each input protection structure. Considering that many integrated circuits now include as many as 100 or more input pins, each with their own input protection structure, the savings in integrated circuit surface area when utilizing the teachings of this invention is quite beneficial.

One embodiment of this invention provides protection against positive ESD pulses greater than 2,000 volts.

Figure 6:
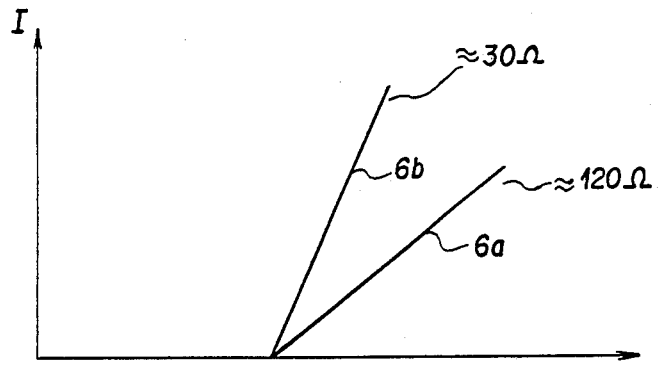
FIG. 6 is an IV plot of the prior art circuit of FIG. 2a and the circuit of FIG. 4 which has been constructed in accordance with the teachings of this invention.

FIG. 6 shows a comparison in the voltage versus current characteristics of a circuit constructed in accordance with the teachings of this invention (line 6b, approximately 30 ohms) as compared with a typical prior art circuit (line 6a, approximately 120 ohms). The increased slope of line 6b is a result of the lowered impedence of a circuit constructed in accordance with the teachings of this invention as compared to prior art circuits. This increased slope indicates that a greater clamping effect is achieved by a lower impedance ESD discharge path.

Figure 7:
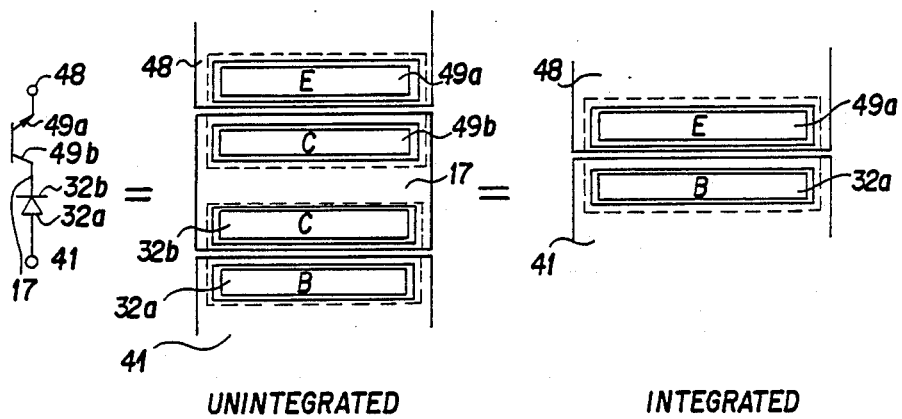
FIG. 7 is a plan view depicting the schematic diagram of a portion of the circuit of FIG. 4, its implementation as discrete devices, and its implementation as a single, integrated device.

FIG. 7 depicts the schematic diagram of a portion of the circuit of FIG. 4, and its implementation as two, unintegrated components, and as a single, integrated component.

Figure 8B:
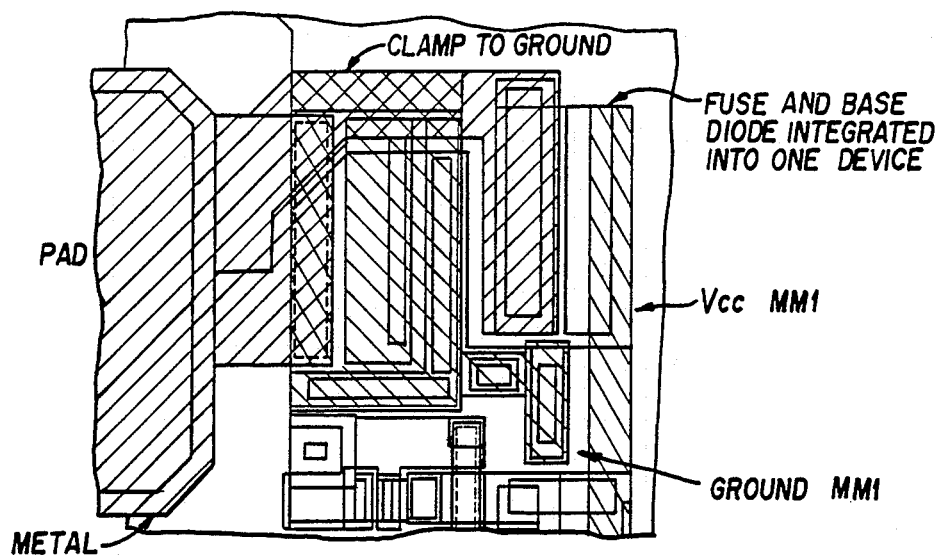
Figure 8A:
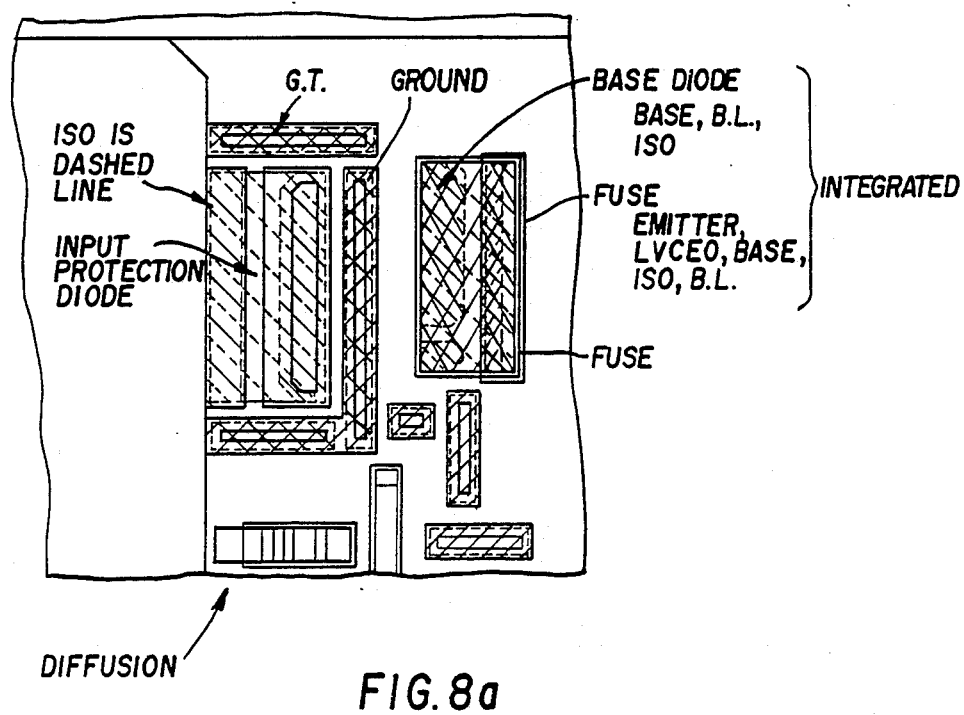
FIG. 8a is a plan view of diffused layers of one embodiment of this invention.

FIGS. 8a and 8b depict greatly magnified representations of the diffused layers and metallic instruments of one embodiment of this structure as constructed in a semiconductor device.

The invention now being fully described, it will be apparent to one of ordinary skill in the art that many changes and modifications can be made thereto without departing from the spirit or scope of the appended claims.

What is claimed is:

1. A circuit comprising:
   an input terminal for receiving an input signal;
   a first supply terminal for receiving a first supply voltage;
   a second supply terminal for receiving a second supply voltage; and
   a first clamp circuit for clamping the voltage level on said input terminal to a voltage in excess of said first supply voltage, thereby preventing said voltage level from exceeding a predefined magnitude in a first polarity defined by said first supply voltage minus said second supply voltage, said first clamp circuit being connected between said input terminal and said first supply terminal, said first clamp circuit comprising a reduced beta bipolar transistor having a first current handling terminal connected to said first supply terminal and a second current handling terminal connected to said input terminal.

2. A circuit as in claim 1 wherein said first clamp circuit serves to clamp said input terminal from positive-going pulses.

3. A circuit as in claim 1 wherein said reduced beta bipolar transistor is constructed as a fuse device.

4. A structure as in claim 3 wherein said fuse device is constructed to have a low impedance and a current handling capability within the range of approximately 150 to 200 milliamps.

5. A structure as in claim 1 wherein said reduced beta bipolar transistor comprises:
   an emitter serving as one of said first and second current handling terminals;
   a collector serving as the other of said first and second current handling terminals;
   a base; and a current handling path connected between said base and said emitter.

6. A circuit as in claim 5 wherein said current path comprises a resistor.

7. A circuit as in claim 1 wherein said first current handling terminal comprises the emitter of a bipolar transistor and said second current handling terminal comprises the collector of said bipolar transistor.

8. A circuit as in claim 7 wherein said bipolar transistor comprises an NPN transistor.

9. A circuit as in claim 1 which further includes a second clamp circuit connected between said input terminal and said second supply terminal for clamping the voltage level on said input terminal in a second polarity opposite said first polarity.

10. A circuit as in claim 1 wherein said second current handling terminal is connected to said input terminal through a diode.

11. A structure as in claim 10 wherein said reduced beta bipolar transistor and said diode are constructed in an integrated fashion, without the use of metallic contacts.

12. A structure as in claim 10 wherein said first supply voltage is approximately 4.5 volts, said first clamp circuit has a clamp voltage of approximately 7.7 volts, and said diode provides a voltage drop of aproximately 0.8 volts, whereby said voltage level on said input terminal is clamped to approximately 13 volts.

13. A circuit as in claim 10 wherein said diode serves to prevent current from flowing between said input terminal and said first supply terminal when said input terminal is connected to said second supply voltage.

14. A circuit comprising:
an input terminal for receiving an input signal;
a first supply terminal for receiving a first supply voltage $V_{cc}$;
a second supply terminal for receving a second supply voltage; and
a first clamp circuit connected between said input terminal and said first supply terminal for clamping input signals of a first polarity defined by said first supply voltage minus said second supply voltage to a desired level $V_{CL}$ in excess of said first supply voltage, said first clamp circuit comprising:
a diode connected between said input terminal and said first supply terminal to prevent current from flowing between said input terminal and said first supply terminal when said input terminal is connected to said second supply voltage;
clamping means having a first and second current handling terminals and comprising a reduced beta transistor connected in series with said diode for providing an input terminal clamping voltage such that $V_{CL} = V_D + V_T + V_{cc}$; where
$V_{CL}$ = the input terminal clamping voltage;
$V_D$ = the forward bias voltage drop of said diode;
$V_T$ = the voltage drop across said clamping means; and
$V_{cc}$ = said first supply voltage.

15. A circuit as in claim 14 wherein said reduced beta bipolar transistor is constructed as a fuse device.

16. A structure as in claim 15 wherein said fuse device is constructed to have a low impedance and a current handling capability within the range of approximately 150 to 200 milliamps.

17. A structure as in claim 14 wherein said reduced beta transistor comprises:
an emitter serving as one of said first and second current handling terminals;
a collector serving as the other of said first and second current handling terminals;
a base; and
a current handling path connected between said base and said emitter.

18. A circuit as in claim 14 wherein said current path comprises a resistor.

19. A circuit as in claim 14 wherein said first current handling terminal comprises the emitter of a bipolar transistor and said second current handling terminal comprises the collector of said bipolar transistor.

20. A circuit as in claim 19 wherein said bipolar transistor comprises an NPN transistor.

21. A circuit as in claim 14 wherein said first clamp circuit serves to clamp said input terminal from positive-going pulses.

22. A circuit as in claim 14 which further includes a second clamp circuit connected between said input terminal and a second supply terminal for clamping the voltage level on said input terminal in a second polarity opposite said first polarity.

23. A structure as in claim 14 wherein said reduced beta bipolar transistor and said diode are constructed in an integrated fashion, without the use of metallic contacts.

* * * * *